United States Patent [19]
Cann et al.

[11] Patent Number: 5,487,787
[45] Date of Patent: Jan. 30, 1996

[54] APPARATUS AND METHOD FOR PLASMA DEPOSITION

[75] Inventors: Gordon L. Cann; Cecil B. Shepard, Jr., both of Laguna Beach; Frank X. McKevitt, Anaheim Hills, all of Calif.

[73] Assignee: Celestech, Inc., Irvine, Calif.

[21] Appl. No.: 369,427

[22] Filed: Jan. 6, 1995

Related U.S. Application Data

[60] Continuation of Ser. No. 3,573, Jan. 13, 1993, which is a division of Ser. No. 698,446, May 10, 1991, Pat. No. 5,204,144.

[51] Int. Cl.⁶ ................................................ C23C 16/00
[52] U.S. Cl. ......................... 118/723 R; 118/723 ER; 118/723 FE; 118/723 FI
[58] Field of Search .............. 118/723 R, 723 EB, 118/723 FE, 723 FI; 427/569, 570, 577

[56] References Cited

U.S. PATENT DOCUMENTS

| | | | |
|---|---|---|---|
| 3,845,739 | 11/1974 | Erhart et al. | 118/49.1 |
| 4,292,342 | 9/1981 | Sarma et al. | 427/34 |
| 4,401,054 | 8/1983 | Matsuo et al. | 118/723 |
| 4,471,003 | 9/1984 | Cann | 427/34 |
| 4,487,162 | 12/1984 | Cann | 118/723 |
| 4,505,947 | 3/1985 | Yukanovic et al. | 427/34 |
| 4,507,588 | 3/1985 | Asmussen et al. | 315/39 |
| 4,585,668 | 4/1986 | Asmussen et al. | 427/38 |
| 4,630,566 | 12/1986 | Asmussen et al. | 118/50.1 |
| 4,691,662 | 9/1987 | Roppel et al. | 118/50.1 |
| 4,767,608 | 8/1988 | Matsumoto et al. | 427/34 |
| 4,913,090 | 4/1990 | Harada et al. | 118/724 |
| 4,958,591 | 9/1990 | Yamazaki | 118/723 |
| 4,987,002 | 1/1991 | Sakamoto et al. | 427/34 |
| 4,989,543 | 2/1991 | Schmitt | 118/723 |
| 4,998,968 | 3/1991 | Misumi | 118/723 |
| 5,063,031 | 11/1991 | Sato | 422/245 |
| 5,068,871 | 11/1991 | Uchida et al. | 373/17 |
| 5,094,878 | 3/1992 | Yamamoto et al. | 427/37 |
| 5,104,634 | 4/1992 | Calcote | 423/446 |
| 5,108,779 | 4/1992 | Gasworth | 427/39 |
| 5,132,105 | 7/1992 | Remo | 423/446 |
| 5,204,145 | 4/1993 | Gasworth | 427/577 |

FOREIGN PATENT DOCUMENTS

| | | |
|---|---|---|
| 012440 | 6/1980 | European Pat. Off. . |
| 165565 | 12/1985 | European Pat. Off. . |
| 59-21026 | 2/1984 | Japan . |
| 59-43861 | 3/1984 | Japan . |
| 63-289926 | 11/1988 | Japan . |
| 1-242141 | 9/1989 | Japan . |
| 1-312008 | 12/1989 | Japan . |

OTHER PUBLICATIONS

JP-A-1157498, Derwent Publications, 1989.
Goldfarb et al., "Deposition of Thin Films and Coatings by Atmospheric Pressure Vapor Plasma Jet", Plasma Chemistry and Plasma Processing March, 1989.
Webster's New World Dictionary, p. 96 (1988).
Webster's New Collegiate Dictionary, p. 1162 (1975).

*Primary Examiner*—R. Bruce Breneman
*Assistant Examiner*—Joni Y. Chang
*Attorney, Agent, or Firm*—Martin Novack

[57] ABSTRACT

The substrate in a plasma jet deposition system is provided with structural attributes, such as apertures and/or grooves, that facilitate efficient deposition. Groups of substrates are arranged with respect to the plasma beam in a manner which also facilitates efficient deposition. In addition to increasing the portion of the plasma beam volume which contacts the substrate surface or surfaces, it is advantageous to provide for the efficient evacuation of spent fluids away from the substrate so that fresh plasma containing the operative species can easily and continuously contact the substrate surface.

2 Claims, 6 Drawing Sheets

APPARATUS AND METHOD FOR PLASMA DEPOSITION

This is a continuation of Ser. No. 08/003,573, Jan. 13, 1993, now pending which was a divisional of Ser. No. 07/698,446, May 10, 1991, U.S. Pat. No. 5,204,144

FIELD OF THE INVENTION

This invention relates to plasma deposition of substances and, more particularly, to plasma deposition on a substrate of films of material such as synthetic diamond by techniques utilizing a plasma jet.

RELATED APPLICATION

The present application is generally related to my co-pending U.S. patent application Ser. No. 08/003,573, filed of even date herewith, and assigned to the same assignee as the present Application.

BACKGROUND OF THE INVENTION

Techniques for depositing substances, such as layers of semiconductor material, using a plasma that is formed into a jet, are well known. For example, my U.S. Pat. Nos. 4,471,003 and 4,487,162 disclose arc jet plasma deposition equipment which utilizes a plasma for deposition of semiconductors and other materials. Ions and electrons are obtained by injecting an appropriate compound, such as a silicon compound, into an arc region, and a jet (or beam) is formed by utilizing magnetic fields to accelerate and focus the plasma. Recently, equipment of this type has been used to deposit synthetic diamond. Superior physical and chemical properties make diamond desirable for many mechanical, thermal, optical and electronic applications, and the ability to deposit synthetic diamond by plasma jet deposition holds great promise, particularly if plasma jet techniques can be improved for this and other purposes.

When a heated plasma jet impinges on a substrate, a significant fraction of the plasma beam is channeled around the substrate without coming in contact with the substrate surface. The energy invested in processing the bypassing portion of the flow into the necessary species of the plasma (e.g. carbon molecules, radicals, and atomic hydrogen, for the case of diamond deposition) does not result in effective deposition, and this substantially increases the cost of the process. Inefficient deposition also increases the time necessary to obtain a desired layer thickness and can waste constituent feedstock. Recycling of feedstock (particularly hydrogen) is possible, but also involves some cost.

It is among the objects of the present invention to improve the efficiency of plasma jet deposition of substances.

SUMMARY OF THE INVENTION

The improvements of the present invention are based, at least in part, on the recognition that the interaction between a plasma beam and target substrate(s) can be controlled, with substantial operational advantage. By improving substrate configuration, location, and orientation, and optimizing parameters of plasma-beam/substrate interaction, the efficiency of the deposition technique can be substantially increased.

In accordance with a form of the present invention, the substrate in a plasma deposition system is provided with structural attributes that facilitate efficient deposition. In a further form of the invention, groups of substrates are arranged with respect to the plasma beam in a manner which also facilitates efficient deposition. Applicant has found that, in addition to increasing the portion of the plasma beam volume which contacts the substrate surface or surfaces, it is advantageous to provide for the efficient evacuation of "spent fluids" (i.e. the remaining parts, mostly gasses, of an elemental volume of plasma which has deposited its operative species on the substrate) away from the substrate so that fresh plasma containing the operative species can easily and continuously contact the substrate surface.

The invention is directed to a method and apparatus for depositing a substance, such as synthetic diamond. A plasma beam is produced, and contains the constituents of the substance to be deposited. [As used herein, the term "beam" is intended to generically include the terms beam and jet.] A substrate is provided, and has a surface (that is, at least one surface) in the path of the beam.

In an embodiment of the invention, grooves, apertures, or both are provided in the substrate, and function to channel spent fluids of the plasma beam away from the deposition surface of the substrate to permit more efficient deposition on the substrate by the operative species of the plasma. In another embodiment of the invention, groups of substrates are provided, with openings between the substrates for evacuation of spent fluids.

In accordance with a feature of the invention, a plurality of substrates are provided having surfaces generally along the envelope of the beam such that constituents (or operative species) in the peripheral region of the beam are applied to the surfaces. The plasma beam can be divided into a plurality of beam portions, and substrates provided with surfaces along the envelopes of the beam portions. At advancing positions in the beam propagation direction, the surfaces of the substrates can be at successively smaller radial distances from the axis of the beam. In this manner, as the beam is consumed [by deposition, and by evacuation of spent fluids through openings in substrates or between the substrates], the substrates continue to approximately envelop the periphery of a remaining smaller beam.

Further features and advantages of the invention will become more readily apparent from the following detailed description when taken in conjunction with the accompanying drawings.

DETAILED DESCRIPTION

Figure 1:
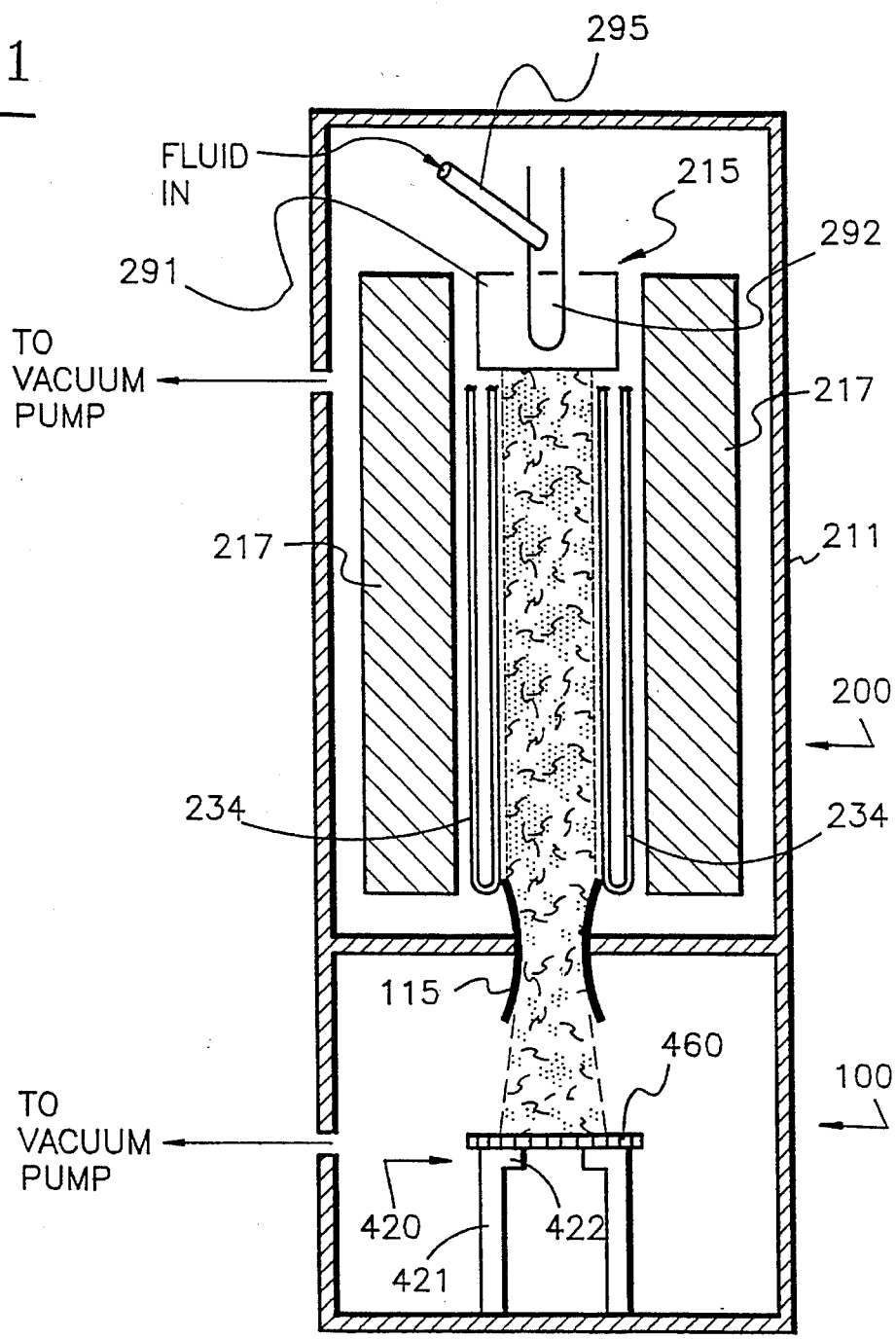
FIG. 1 is a diagram, partially in schematic form, of an apparatus which can be utilized to practice an embodiment of the invention.

Referring to FIG. 1, there is shown an embodiment of an apparatus in accordance with the invention and which can be used to practice an embodiment of a method the invention. A deposition chamber 100 is the lower section of a plasma jet deposition system 200, evacuated by one or more vacuum pumping systems (not shown).

The system 200 is contained within a vacuum housing 211 and includes an arc-forming section 215 which comprises a cylindrical anode 291, a rod-like cathode 292, and an injector 295 mounted adjacent the cathode so as to permit injected fluid to pass over the cathode. In the illustrated embodiment the input fluid may be, for example, a mixture of hydrogen and methane. The methane could alternatively be fed in downstream. The anode 291 and cathode 292 are energized by a source of electric potential (not shown), for example a DC potential. Cylindrical magnets, designated by reference numeral 217, are utilized to accelerate and focus the plasma generated at the arc forming section. The magnets maintain the plasma within a narrow column until the plasma reaches the deposition region. A nozzle, represented at 115, can be used to control beam size and velocity, within limitations. Cooling coils 234, in which liquid nitrogen can be circulated, are located within the magnets and surround the focused plasma.

In an example of operation, a mixture of hydrogen and methane is fed to the injector 295, and a plasma is obtained in front of the arc forming section and accelerated and focused toward the deposition region. As is known in the art, synthetic polycrystalline diamond can be formed from the described plasma, as the carbon in the methane is selectively deposited as diamond, and the graphite which forms is dissipated by combination with the hydrogen facilitating gas. For further description of plasma jet deposition systems, reference can be made to U.S. Pat. Nos. 4,471,003 and 4,487,162. It will be understood that other suitable types of plasma beam deposition equipment can be used in conjunction with the features of the invention to be described.

Figure 2:
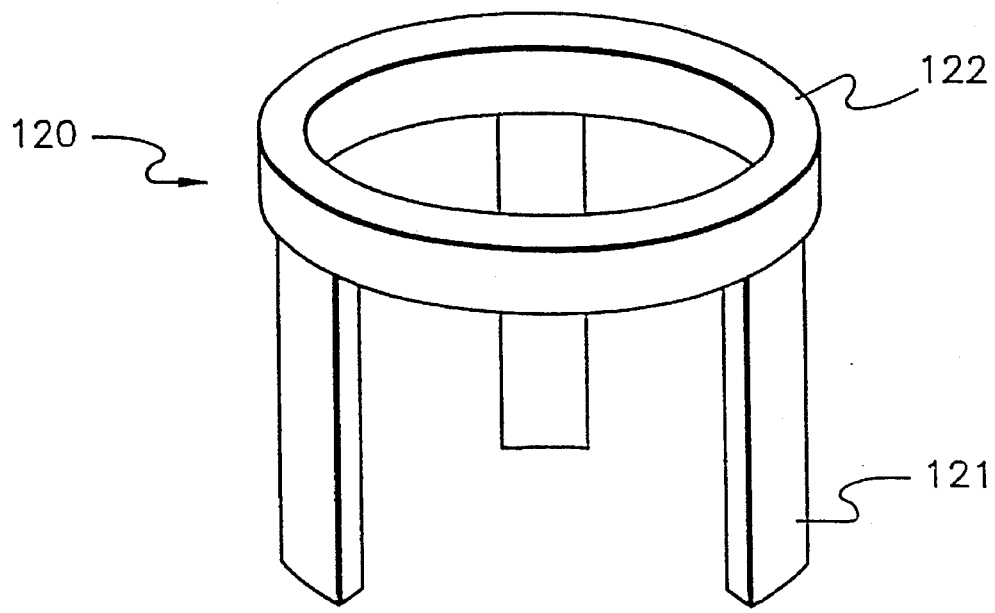
FIG. 2 is a diagram of the stand of the FIG. 1 apparatus.

In the embodiment of FIG. 1, the deposition chamber 100 contains a substrate holder in the form of an opened cylindrical stand 120 with legs 121 and an annular base 122 to which a substrate can be secured (see also FIG. 2). A temperature controlling device (not shown) or other suitable device can be mounted on the base, if necessary or desired. A substrate 160 is mounted on the holder 120, such as by retainer bolts (not shown). [As used herein, the term "substrate" is intended to mean an object having at least one surface on which a substance is to be deposited. It will be understood that a substrate may only temporarily hold a deposited layer which is intended for subsequent removal from the substrate. A substrate may also be an object on which the deposited surface is intended to be permanently affixed; for example, the substrate may be the base of a wear surface of deposited synthetic diamond, such as for ultimate use in a tool.]

Figure 3:
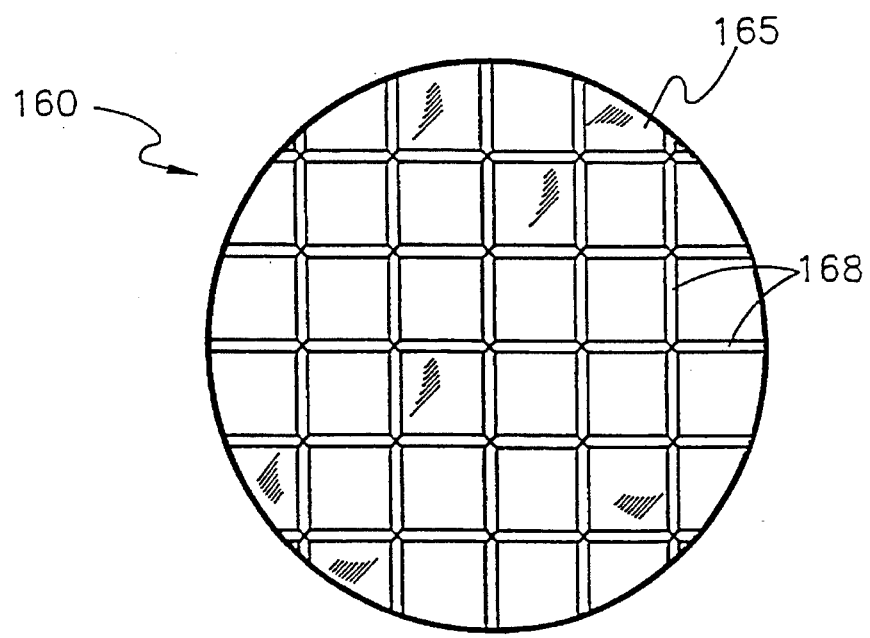
FIG. 3 is a top view of an embodiment of a substrate in accordance with a form of the invention.

FIG. 3 shows an embodiment of a substrate 160, which has a deposition surface 165 that is shown as being generally flat and has a pattern of grooves 168 which, in this illustration, are in a two-dimensional grid pattern. The grooves preferably have a smooth trough-like contour, although any suitable contour, for example triangular, can be utilized. The grooves extend generally across the substrate and to the edges of the substrate surface. The preferred depth of the grooves can depend on the substrate size and the operating conditions, a suggested minimum depth being about 2 mm. In operation, the grooves facilitate deposition by a plasma beam. As the operative species in the plasma are deposited on the substrate surface, the spent fluids are more readily evacuated from the deposition region by being channeled by the grooves to the edges of the substrate. The grooves also serve to divide the substrate area into relatively smaller individual regions. For some applications, this is advantageous in obtaining deposited films that are less likely to break or crack than larger area films.

Figure 4:
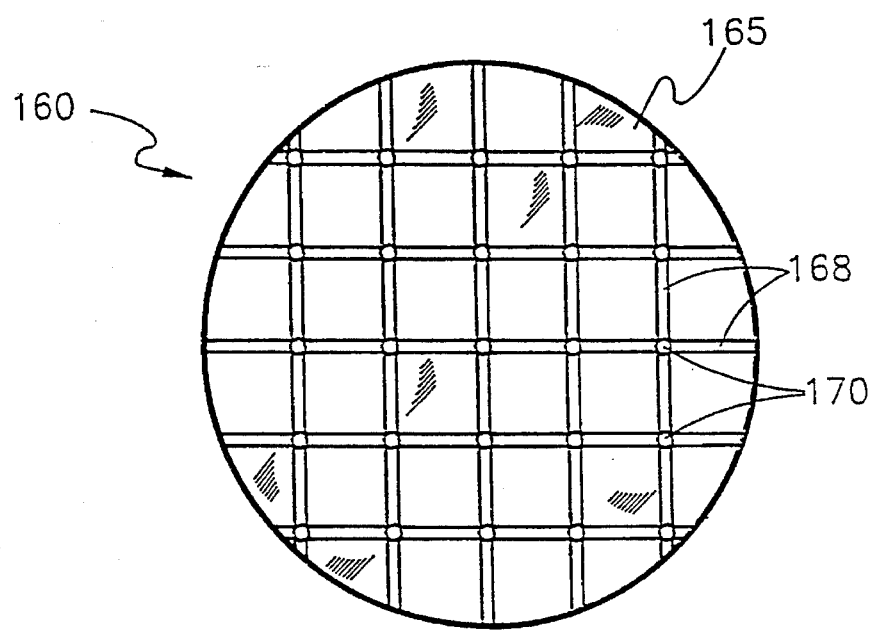
FIG. 4 is a top view of another embodiment of a substrate in accordance with a form of the invention.

FIG. 4 illustrates a substrate having a groove pattern like that of FIG. 3, but with a plurality of apertures 170 through the substrate. In this example, the apertures are located at the groove intersections. Spent fluids are channelled to the apertures as well as to the edges of the substrate. The apertures may also serve to equalize pressure conditions over the substrate surface to result in more uniform deposition. It will be understood that one or more apertures can be employed, with or without grooves, if desired. Also, in this and other embodiments, the substrate surface can be curved.

Figure 5:
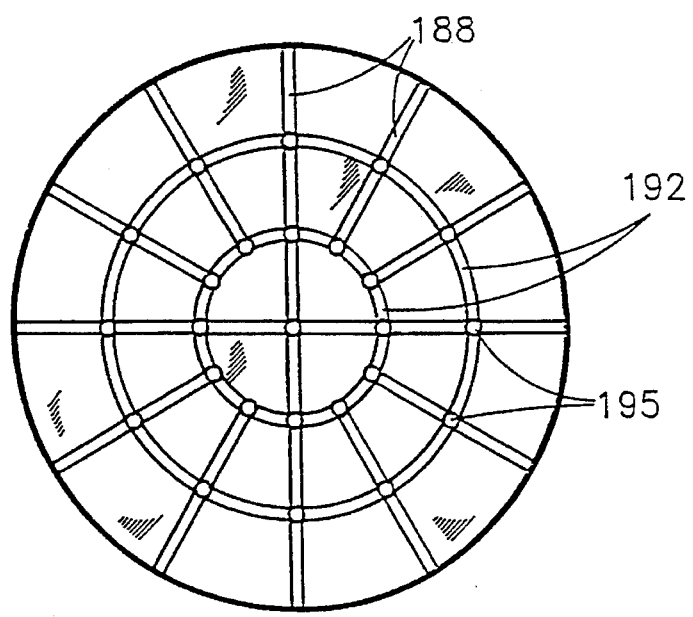
FIG. 5 is a top view of another embodiment of a substrate in accordance with a form of the invention.

FIG. 5 illustrates another example of a substrate configuration with grooves and apertures, this embodiment having radial grooves 188, circular grooves 192 intersecting the radial grooves, and apertures 195 at the intersections. It will be understood that other apertures and/or further apertures can be provided which are not in the grooves or not at the groove intersections.

Figure 6:
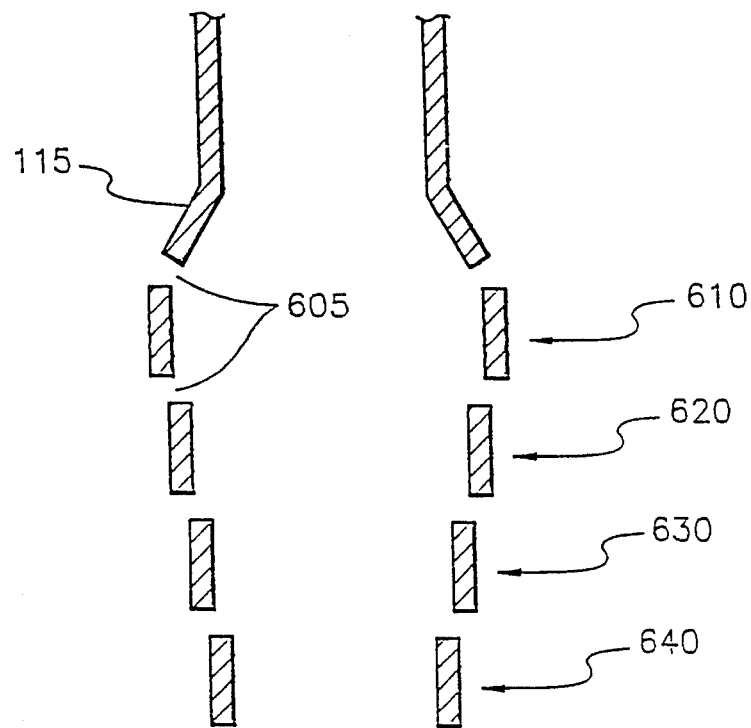
FIG. 6 is a cross-sectional view of a substrate array in accordance with an embodiment of the invention.

FIG. 6 illustrates a substrate array in accordance with an embodiment of the invention. In this embodiment (see also FIG. 7), the array in the deposition chamber 100 includes a number of substrates having surfaces that are generally parallel to the beam direction. Substrate surfaces at advancing positions in the beam propagation direction (that is, successively further from the plasma beam source) are at successively smaller radial distances from the beam axis. In particular, the embodiment of FIG. 6 shows four groups of substrates 610, 620, 630 and 640 at four successively smaller radial distances from the beam axis as the beam progresses. In the illustrated embodiment, each group of substrate surfaces has a hexagonal cross-section (two substrates of each group being visible in FIG. 6), a perspective view of two adjacent groups (e.g. 630, 640) being illustrated in FIG. 7. It will be understood that other arrangements could be employed, for example the group cross-sections could be triangular, rectangular, pentagonal, octagonal, etc. In the illustrated embodiment, the groups of substrates are shown secured together by brackets 631, 641 and bolts 632, 642. Preferably, the contact between substrates and the brackets help to maintain the group at substantially the same temperature. Between the groups of substrates are openings 605 through which the spent fluids can progress toward the vacuum pumping system. Brackets such as 655 can be used between the respective groups, and other supporting structure (not shown), including a stand of the type shown in FIG. 2, can be used to support the substrate array in the deposition chamber or to secure the array, or portions thereof, to the chamber.

Figure 7:
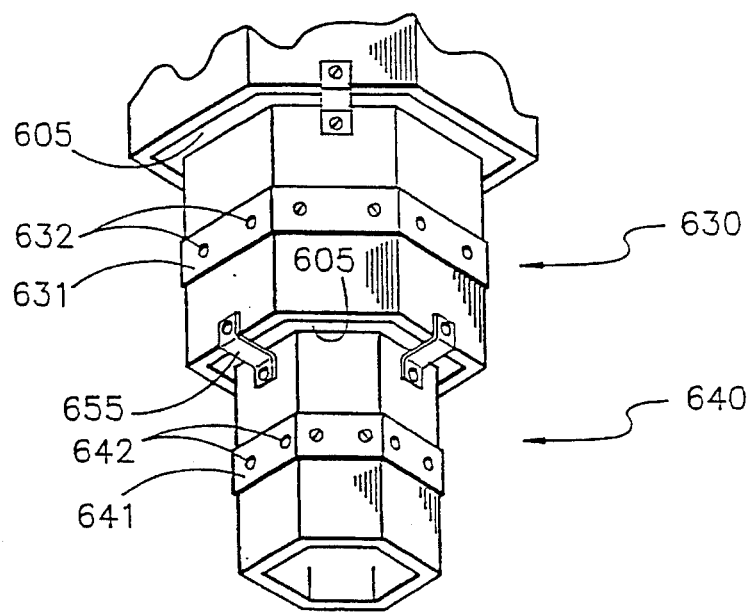
FIG. 7 is a perspective view of a portion of the substrate array of FIG. 6.
Figure 8:
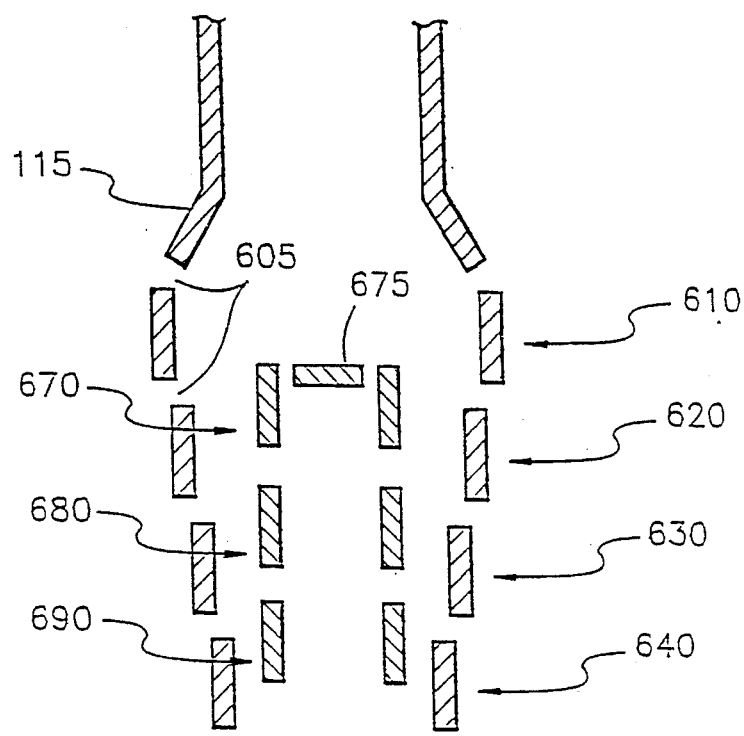
FIG. 8 is a cross-sectional view of a substrate array in accordance with another embodiment of the invention.

The embodiment of FIG. 8 is like that of FIG. 7, but also has coaxial groups of substrates 670, 680, 690, with openings therebetween, as before. These can also be in hexagonal or other suitable arrangements. A further substrate 675 is shown as being perpendicular to the beam direction and contributes to formation of the beam into a generally annular cross-section, with most of the deposition on the inner surfaces of the substrates of groups 610, 620, 630 and 640, the outer surfaces of the substrates of groups 670, 680 and 690, and the top surface of substrate 675. If desired, the substrate 675 can be omitted, with resulting co-axial flow around the substrate groups 670, 680 and 690, with deposition on both the inner and outer surfaces of the substrates of these groups. In this and other embodiments, supporting structures can be of the types illustrated in FIGS. 2 and 7, or of any suitable type.

Figure 9:
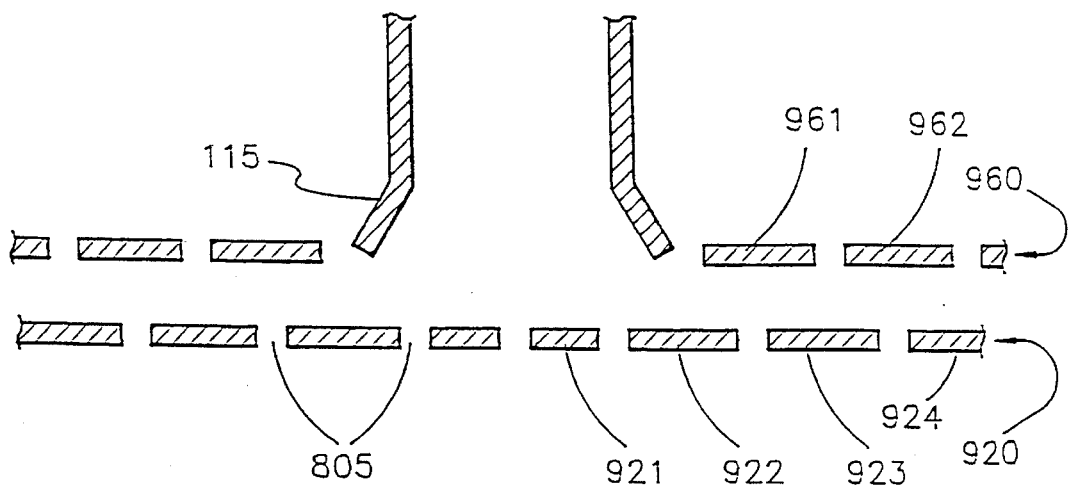
FIG. 9 is a cross-sectional view of a substrate array in accordance with a further embodiment of the invention.
Figure 10:
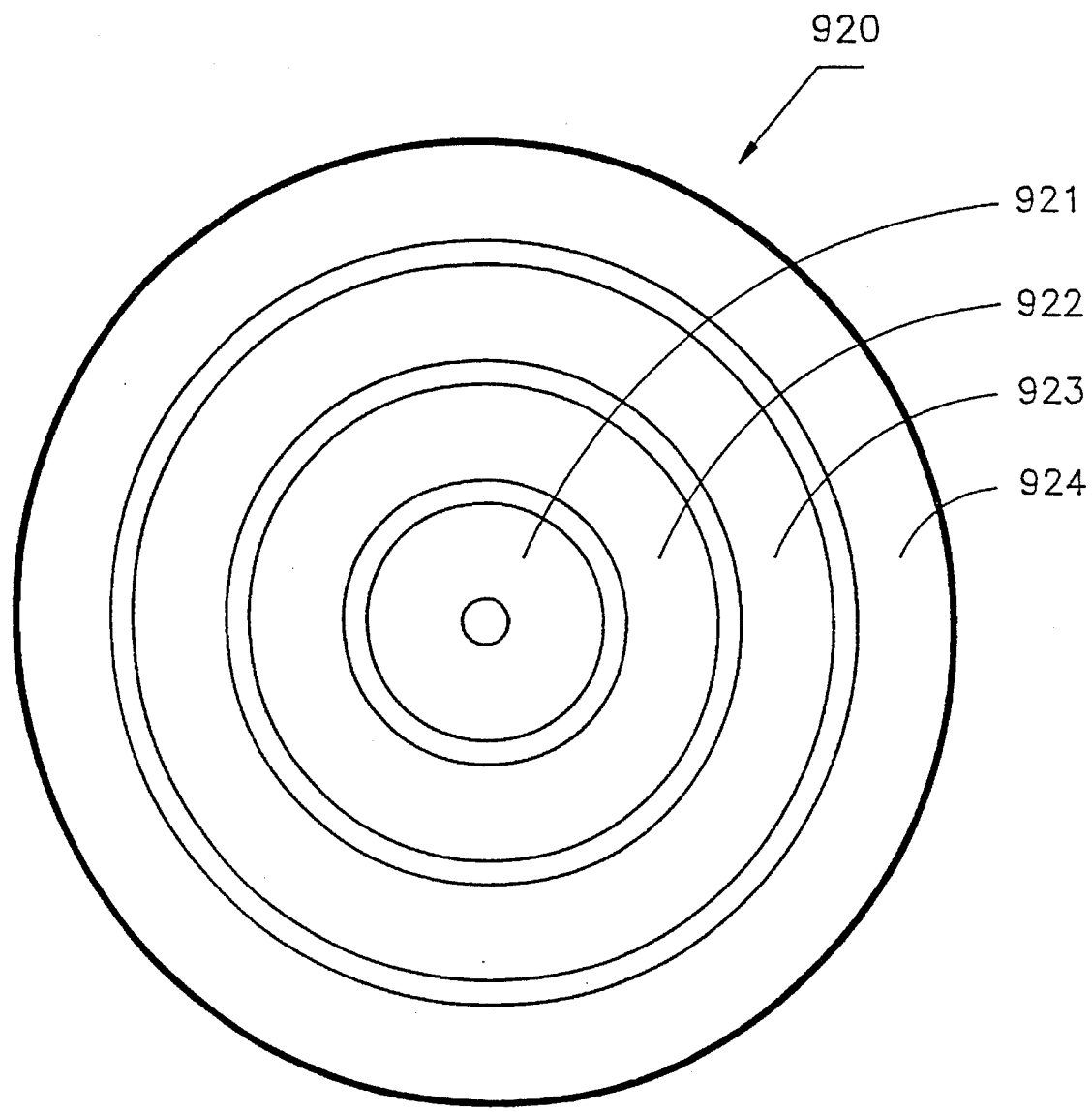
FIG. 10 is a bottom view of the substrate array of FIG. 9.

FIG. 9 shows a configuration of substrates in accordance with another embodiment of the invention wherein the plasma beam is formed into a radially propagating beam that is generally enveloped by substrate surfaces. In the illustrated embodiment of FIG. 9, the beam leaving the nozzle 115 encounters a "T" that is formed by annular rings of substrates. The bottom set 920 of substrate rings is shown in FIG. 10, and includes annular rings 921, 922, 923 and 924. Ring 921 has a central aperture, and there are openings 805 between the other rings. The top set 960 of substrate rings includes annular rings 961 (adjacent nozzle 115) and 962. Again, brackets or other suitable supports (not shown) can be provided.

It will be understood that any of the substrates in the embodiments of FIGS. 6–10 can have apertures and/or grooves, as described in conjunction with FIGS. 2–5. Also, the substrates, or arrays thereof, can be tilted and/or moved with respect to the beam, as described in copending U.S. patent application Ser. No. 08/003,573, first referred to above.

We claim:

1. Apparatus for depositing a substance, comprising:

means for producing a plasma beam containing the constituents of said substance, said beam having a generally cylindrical elongated envelope and a longitudinal axis; and a plurality of target substrates on which said substance is to be deposited, said substrates having surfaces generally along the envelope of the beam that are parallel to the longitudinal axis of said beam.

2. Apparatus for depositing synthetic diamond, comprising:

means for producing a plasma beam containing a carbonaceous gas and hydrogen gas, said beam having a generally cylindrical elongated envelope and a longitudinal axis; and a plurality of target substrates on which said beam is to be deposited, said substrates having surfaces generally along the envelope of the beam that are parallel to the longitudinal axis of said beam.

* * * * *